THIN SKIN PACKAGING FOR ELECTRICAL COMPONENTS

Filed Aug. 17, 1967

United States Patent Office 3,474,185
Patented Oct. 21, 1969

3,474,185

THIN SKIN PACKAGING FOR ELECTRICAL COMPONENTS

John James Ahearn, Jr., Lancaster, and William Leander Taylor, Elizabethtown, Pa., assignors to AMP Incorporated, Harrisburg, Pa.

Filed Aug. 17, 1967, Ser. No. 661,349
Int. Cl. H05k *5/00*
U.S. Cl. 174—52 7 Claims

ABSTRACT OF THE DISCLOSURE

A package for electrical components is disclosed having a protective wall structure comprised of a thin sheet of hard insulating material having apertures therein through which is flowed a potting compound; the apertures being controlled in diameter to restrict the exposed surface area of the potting compound in a manner to reduce cracks therein and permit the use of a total wall thickness considerably less than has been heretofore required. Leads to and from packaged components are fitted through grommets in the apertures which serve to dam the compound against leakage and to preclude lead flexure from destroying package integrity.

BACKGROUND OF THE INVENTION

In the art of packaging electrical or electronic components a standard practice has developed wherein components are potted in an insulating and dielectric material with leads to and from the components being made to extend through the potting compound. Typical potting compounds used for this purpose include commercially available epoxy thermosetting resins to which is added a suitable hardening agent. In general it has been found to be necessary to surround the components with potting compound of a thickness at least on the order of between one-quarter and three-eights of an inch. This practice is necessitated by the fact that a surrounding wall of lesser thickness can develop fine cracks which permit entry of contaminants or out-gassing of the materials of the packaged components. The problem is aggravated if the package is required to experience substantial differentials in pressure and/or temperature as encountered in vehicles which must undergo altitude or depth changes. Surface cracks in component packages also serve to define voltage breakdown paths and sites where corona discharge may occur.

As a somewhat related problem, the requirement for a relatively thick wall of potting compound means that some considerable period of time may be required until the compound is fully hardened. It is not unknown to find an electronic component package potted with epoxy compound to be incompletely cured a month or more after an initial potting. While curing of potting compounds can be generally accelerated by the application of heat or pressure, this additional and expensive step risks possible damage to the packaged components; some of which may be sensitive to heat or pressure. Moreover, unless adequately supported, the packaged components may tend to float or drift within the potting compound during the period of curing and eventual setting with the result being that the desired wall thickness is no longer maintained, at least in a portion of the package.

Still another problem with present day packaging techniques of electronic components arises in the use of leads to and from the component extended through the potting compound, which leads contain a flexible insulating and protective sheath. In high voltage assemblies for example, the leads are surrounded by a sheath of relatively soft material, such as silicone rubber, with the result that deformation of the lead material can occur quite easily, breaking the lead sheath material away from the potting compound to open up a leakage path into the package. Leads surrounded by a sheath of hard material, on the other hand, may develop leakage paths because of dissimilarities in thermal expansion between the lead material and the potting compound, which tends to pull away from the harder material as the potting material sets. A problem also arises in the use of potting material with leads which serve as paths of flow for the potting material when it is in the initial state.

SUMMARY OF THE INVENTION

The present invention relates to package for electrical or electronic components having a thin protective and insulating wall of material which provides package integrity in less space, of less weight and less cost than heretofore available.

It is an object of the present invention to provide an improved package and method of packaging electrical or electronic components. It is a further object to provide a package wherein leads surrounded by relatively soft or flexible insulating material may be used with less likelihood of leakage paths due to contraction or expansion of potting materials used for the package. It is a further object to provide a package which facilitates potting with respect to components and component leads.

The invention overcomes the foregoing problems and achieves the foregoing objectives by a package wall comprised of a composite of standard potting compound such as epoxy and an outer skin formed of a thin sheet of hard material such as glass filled epoxy sheet having apertures therein restricted to a diameter to prevent surface cracks from developing in the potting material. The apertures in the thin sheet of the package are utilized to accommodate flexible insulating bushings fitted and held therein which, in turn, accommodate the sheath of electrical leads extended into and from the component held within the package to prevent flow during potting and prevent leakage paths after the potting material has hardened.

Figures 1, 2, 3, 4, 5:
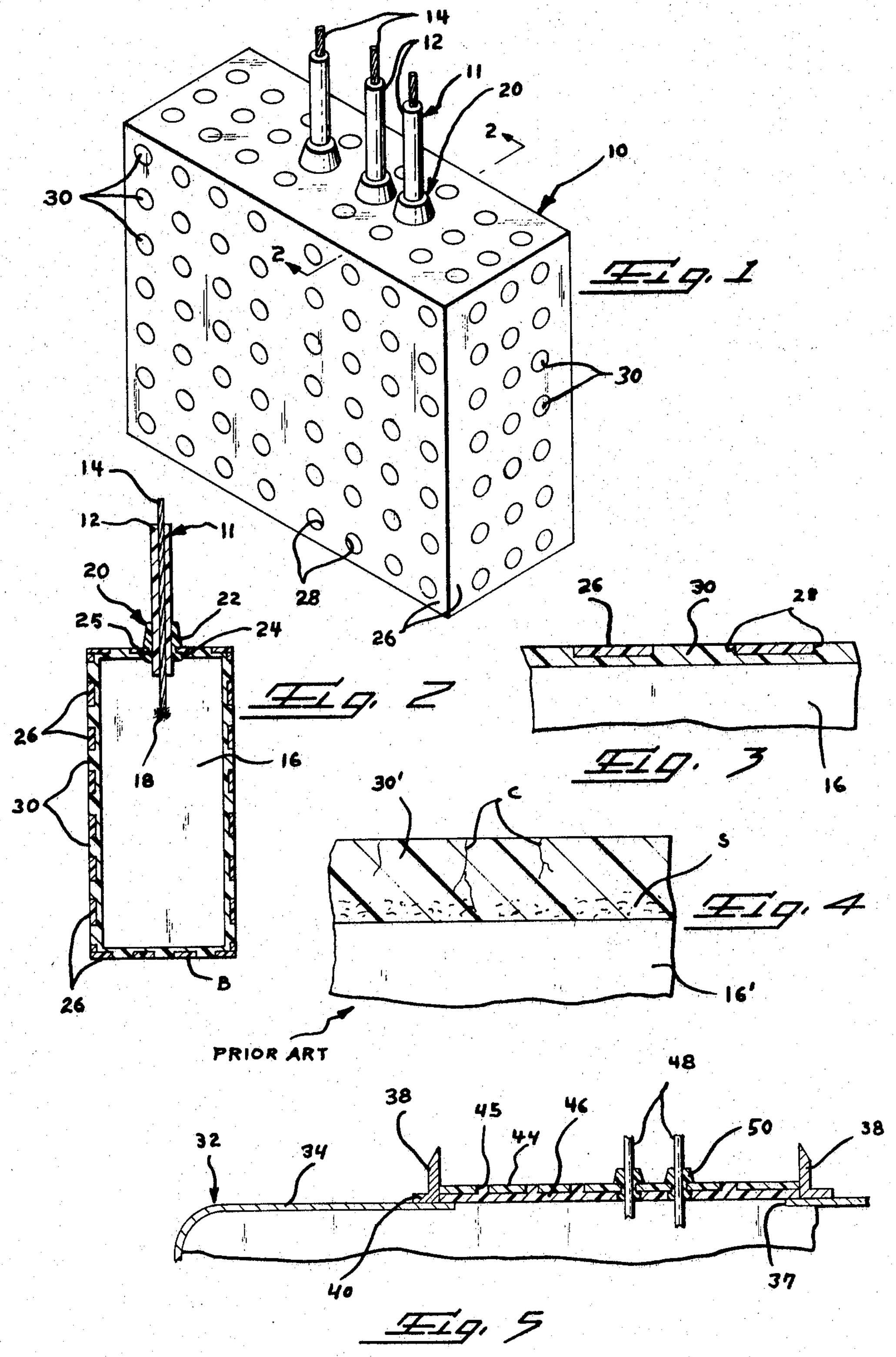
FIGURE 1 is a perspective view of a package containing electrical or electronic components and having a number of leads extending therefrom in accordance with the concept of the invention.
FIGURE 2 is a sectional view of the package of FIGURE 1, taken along lines 2—2.
FIGURE 3 is an enlarged sectional view of a portion of the package shown in FIGURES 1 and 2.
FIGURE 4 is a sectional view of a part of a package in accordance with the prior art.
FIGURE 5 is a sectional view of a different package wherein the invention is utilized in conjunction with a standard housing.

Referring now to FIGURE 1, the device 10 represents a capacitor package for high voltage use. Within 10 a number of high voltage capacitors are contained and interconnected to develop and store high voltage charges. The capacitor plates are connected to a series of leads 11, each comprised of a surrounding and protective sheath 12, which is typically silicone rubber, and a conductive core 14, which is typically of tinned strands of copper. A capacitor plate is shown as 16 in FIGURE 2, terminated as by soldering at 18 to the core 14 of a lead 11. The protective sheath 12 of the lead is made to extend down within the package.

In accordance with the invention the capacitor plates and the dielectric spacing material therebetween form a solid component of a general configuration evidenced in FIGURE 2. The component formed thereby must be protected in a mechanical sense from damage in shipment and in use and it must be protected in operation against adverse environment. In many instances this evironment may be expected to contain extremes of temperature, pressure, the presence of moisture or contaminating gasses, which can cause or accelerate breakdown or at least deterioration of the capacitor. There may be a requirement that the materials used in the capacitor be prevented from out-gassing, if the package must experience substantial negative pressures. If the components carry a voltage higher or lower than the surrounding equipment, which is typically true of a capacitor and generally true of any electrical or electronic component, insulation and isolation must be provided. This requirement is usually expressed in terms of voltage breakdown. Since both voltage breakdown and corona discharge are related to altitude in those applications where a pressure differential will be experienced the voltage breakdown rating is coupled with a given altitude rating. A typical specification must be thus expressed as 5000 volts at 70,000 feet.

FIGURE 4 shows the prior art approach wherein an electronic component 16' is covered over by a potting compound 30' to a thickness sufficient to preclude a breakdown through any surface cracks shown as C in FIGURE 4. Cracks appear to develop in potting compounds which are sufficiently hard to provide mechanical protection of the package. As a further point, the presence of a crack can form a site for corona discharge. If corona develops it will cause a deterioration of adjacent insulating and dielectric material tending to enlarge and extend the crack until eventually the unit fails.

With the prior art approach evidenced in FIGURE 4 there is the other problem mentioned above of delayed hardening. Typical potting material, such as epoxy begins to cure from the exposed surface of 30' and sets first at such surface and then to an extent extending down beneath such surface so that the walls may appear to be quite hard and fully cured. Experience has shown, however, that curing takes place rather slowly in the layers beneath the surface to result in an uncured and rather soft area in the region shown as S in FIGURE 4, for a considerable period of time. Tests of the outside surface do not reveal the degree of cure in the layers well under such surface. This leads to the practice of storing the unit after production to be sure that the package wall is fully cured; or, more frequently, to shipment for use with the package wall not fully cured. If the component is supported by the package wall, as it frequently is, it may tend to drift under the forces of gravity and impacts of shipment, distorting the package and reducing the effective thickness of the wall.

The package of the invention contemplates the use of a skin of prehardened material such as a glass-filled epoxy sheet shown as 26 in FIGURES 1–3. The sheet 26 contains a series of apertures 28 extending therethrough, which may be cut as by drilling or, in certain instances, punched in a pattern in the manner indicated in FIGURES 1–3. These apertures serve three purposes. First, the edges of the aperture restrict the exposed and unsupported surface area of the potting compound shown as 30 in a manner precluding or at least minimizing surface cracks. The reason for this is not fully understood, but has been discovered in practice to work with a number of standard potting compounds. The apertures 30 are shown as circular, as this is the most efficient way of minimizing surface area for a given aperture dimension. It is contemplated that the apertures may be of other geometries as long as the surface area provided minimizes the presence of cracks. The dimension of the apertures is somewhat dependent upon the viscosity of the potting material employed. For a standard epoxy potting compound, Hysol No. 9–4190 resin using H2–3404 hardener, mixed and heated to have a viscosity of approximately 4400 centiposes, apertures approximately $\frac{3}{16}$ of an inch in diameter worked well.

A second use of apertures 28 is to permit the potting compound to be flowed within the package to surround the component therein and preclude the presence of voids in any part thereof. Voids or bubbles within the potting compound can serve as sites for corona even though not exposed to the outside surface. In practice, the package walls are assembled around the component with the component center therein, as indicated in FIGURE 2, all within a vessel which may be evacuated. Then, the potting compound 30 is flowed through the apertures 28 with a low vacuum being pulled and maintained so that all air spaces within the package are eliminated. To assure a complete fill it may be advisable to overpour by providing more compound than is required to fill the package. After a short time, sufficient for curing of the potting compound to begin, the package may be removed with the surfaces thereof then being ground down to the hard skin formed by sheet 26. As indicated in FIGURE 2, the amount of potting compound employed is considerably reduced from that which is required in prior art practice. In a typical example the outer skin 26 was comprised of an epoxy glass approximately $\frac{1}{32}$ of an inch thick with the potting compound thickness apart from the skin being approximately $\frac{1}{16}$ of an inch in thickness.

It may be preferable to flow the potting compound from the bottom of the package indicated by the letter B in FIGURE 2. In practice it has been found to be possible to provide the apertures 28 in only a portion or portions of the surfaces of the thin skin. In an actual unit having exterior configuration like that shown in FIGURES 1 and 2, the side and end walls of the package were comprised of a solid, thin epoxy glass sheet with the bottom sheet being apertured as indicated. Examination of the finished package revealed no cracks in the potting compound and a test of the unit showed that it was capable of passing a specification which heretofore required a $\frac{3}{8}$ inch potting thickness.

By way of example, to package an electronic component having a 1 cubic inch volume the prior art would require a package having a volume of considerably more than five cubic inches whereas a package made in accordance with the invention for the same component volume would require a volume of well under three cubic inches. This saving of over fifty percent runs to advantages which are almost directly proportional to savings in cost and weight, in addition to a saving in space. Additionally, the thin skinned package concept of the invention eliminates the need for storing the package for any considerable period of time to permit final curing of the potting compound, or the alternative of risking drift of components by shipping uncured component packages.

Referring to FIGURE 2, as a further aspect of the invention, the leads for the package are extended through the thin skin composite by the use of flexible grommets shown as 20, which are fitted through the apertures 28 in a position to minimize lead length to the connection with a given component. The grommets 20, in the preferred embodiment, include a beveled portion 22 permitting the grommets to be snapped into the sheet 26 through the aperture thereof with a rear flange portion 24 catching on the inner surface of the sheet. The edges of the aperture fit into an annular recess 25 of the grommet so that the grommet is mechanically held in the sheet 26. The lead 11 is fitted through the grommet with the insulation 12 thereof being slightly compressed by the grommet material when the grommet and lead are in the position shown in FIGURE 2. When the potting material is flowed into position it engages the surface of the grommet but not the sheath of the lead. The grommet serves as a dam. The grommet material can be chosen to be sufficiently flexible to maintain a seal of the lead material and a seal of the thin wall and potting compound composite. If the leads are bent in use the grommet serves to permit a slight flexure without opening a path into the package, as is the case wherein the lead sheath itself is made to extend directly through the package wall and therewithin. The assembly shown in FIGURE 2 accommodates leads of relatively soft and flexible material, such as silicone rubber or a slightly harder material such as polyvinyl chloride or the like.

It is contemplated that the invention may be utilized in conjunction with a standard packaging technique wherein the thin wall construction serves to carry leads into some larger package or through a bulkhead comprised of other materials. FIGURE 5 shows a portion of an electronic assembly 32 having a metallic outer covering 34 containing therewithin electronic equipment which may be fixed within the covering and surrounded by some insulating medium. In accordance with the invention, an aperture 37 provided in 34 facilitates leads to and from the devices within 32. The assembly may include a flange shown as 38 extending out from the wall 34 and turned as at 40 to be fastened to the wall, as by soldering or brazing. It is contemplated that the invention may be applied by placing a thin skin or sheet 44 suitably apertured as at 45, to define the apertures heretofore discussed in a position to receive the leads from the assembly shown as 48 extended through grommets 50 secured within the sheet 44. Then, potting compound 46 may be flowed through the apertures in the sheet to perfect the insulating, isolating and protective cover heretofore defined. Again, with the invention, the covering may be made quite thin without concern for surface cracks which can occur if unsupported potting compound is employed. The invention technique substantially accommodates flexible leads into the assembly without concern for the usual problem of leakage paths being created around the leads due to deformation in use, pulling the lead material away from the potting compound.

It is also contemplated, however, that the invention in a major aspect thereof may be used with non-flexible leads or terminal posts, turret lugs or threaded studs. It is contemplated that leads or other terminations may be made through more than one surface.

Having now disclosed the invention in terms intended to enable a preferred practice thereof, I define what I consider to be inventive through the appended claims.

What is claimed is:

1. In a package for protecting and insulating electrical or electronic components an assembly comprised of components, a thermosetting compound and an outer cover, at least a substantial portion of said outer cover being comprised of thin hard insulating sheet material including a series of apertures extending therethrough, said apertures being in number and distributed in a pattern to extend throughout the major surface area of said sheet material, said potting compound being flowed into and through said apertures to fill said apertures and extend beneath said sheet material and around said components to provide a substantially void free volume, said apertures having a major dimension relative to the viscosity of said potting compound to preclude surface cracks in said potting compound as exposed within said aperture whereby to facilitate a thickness of potting compound beneath said sheet material not appreciably greater than the thickness of said sheet material.

2. The package of claim 1 wherein said outer cover is entirely comprised of said sheet material having said aperture therein.

3. The package of claim 1 wherein said sheet material is comprised of a prehardened glass-filled thermosetting material and said potting compound as flowed is an uncured thermosetting resin in liquid form.

4. The package of claim 1 wherein there is included extending through at least one of said apertures a grommet of insulating material adapted to carry a lead having an insulating sheath thereover through said wall portion.

5. The package of claim 4 wherein said grommet includes an outer flange portion extending outwardly from the outer surface of said sheet material to support the sheath of said lead relative to a bending thereof and the said grommet includes an inner flange portion separated from said outer flange portion by a groove fitted over said sheet material along the edge of said aperture and operable to dam the flow of said potting material out along the sheath of said lead and out of said package.

6. In a method of packaging electrical and/or electronic components, the steps comprising positioning said components within a housing including an outer wall comprising at least a substantial portion of the outer surface of said housing, said wall being comprised of a thin, hard insulating material having a pattern of apertures therein extending over the surface thereof, each aperture being of a diameter to permit an easy flowing of thermosetting and insulating potting compound therethrough but not so large as to result in cracks in the outer surface thereof when said compound becomes hard, and then flowing a thermosetting and insulating potting compound through the said apertures of said wall to substantially surround the said component and fill the said housing.

7. The method of claim 6 wherein as a further step the said compound is in quantity sufficient to overflow said housing and cover the exterior of said wall, and thereafter the said wall is then trimmed to remove excess potting compound from the surface thereof.

References Cited

UNITED STATES PATENTS

| | | | |
|---|---|---|---|
| 1,843,622 | 2/1932 | Norton | 264—272 X |
| 3,016,580 | 1/1962 | Jaeschke | 264—272 X |

LEWIS H. MYERS, Primary Examiner

D. A. TONE, Assistant Examiner

U.S. Cl. X.R.

264—272